United States Patent
Naniwa et al.

(10) Patent No.: US 11,437,978 B2
(45) Date of Patent: Sep. 6, 2022

(54) MULTIPLEXER, HIGH-FREQUENCY FRONT-END CIRCUIT, AND COMMUNICATION DEVICE

(71) Applicant: Murata Manufacturing Co., Ltd., Kyoto (JP)

(72) Inventors: Yusuke Naniwa, Kyoto (JP); Masakazu Tani, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 210 days.

(21) Appl. No.: 16/998,286

(22) Filed: Aug. 20, 2020

(65) Prior Publication Data
US 2020/0382102 A1 Dec. 3, 2020

Related U.S. Application Data

(63) Continuation of application No. PCT/JP2019/006564, filed on Feb. 21, 2019.

(30) Foreign Application Priority Data

Mar. 8, 2018 (JP) .............................. JP2018-042063

(51) Int. Cl.
*H03H 9/72* (2006.01)
*H03H 9/64* (2006.01)
(Continued)

(52) U.S. Cl.
CPC .......... *H03H 9/72* (2013.01); *H03H 9/02559* (2013.01); *H03H 9/145* (2013.01);
(Continued)

(58) Field of Classification Search
CPC ...... H03H 9/02559; H03H 9/145; H03H 9/25; H03H 9/64; H03H 9/72; H03H 9/725; H04B 1/0057; H04B 1/40
(Continued)

(56) References Cited

U.S. PATENT DOCUMENTS

| 4,720,674 A * | 1/1988 | Takeuchi ............... G01S 15/582 324/76.59 |
| 2006/0145782 A1* | 7/2006 | Liu ........................ H03H 7/463 333/132 |

(Continued)

FOREIGN PATENT DOCUMENTS

| JP | H09-98046 A | 4/1997 |
| JP | 2003-283363 A | 10/2003 |

(Continued)

OTHER PUBLICATIONS

International Search Report for Application No. PCT/JP2019/006564 dated May 21, 2019.

(Continued)

*Primary Examiner* — Tan H Trinh
(74) *Attorney, Agent, or Firm* — Pearne & Gordon LLP

(57) ABSTRACT

A multiplexer includes a common terminal, a first acoustic wave filter having a first frequency band as a pass band, and having a first input/output terminal connected to the common terminal, a second acoustic wave filter having a second frequency band higher than the first frequency band as a pass band, and having a second input/output terminal connected to the common terminal, an inductance element, and a first capacitance element. The first acoustic wave filter has a parallel resonator of which one end is connected to the first input/output terminal and another end is connected to a ground electrode, and the first input/output terminal is connected to the common terminal via the inductance element, and the first capacitance element is connected between a signal path between the one end of the parallel resonator and the inductance element, and a ground electrode.

10 Claims, 6 Drawing Sheets

(51) Int. Cl.
  *H03H 9/25* (2006.01)
  *H03H 9/145* (2006.01)
  *H03H 9/02* (2006.01)
  *H04B 1/40* (2015.01)

(52) U.S. Cl.
  CPC ............... *H03H 9/25* (2013.01); *H03H 9/64* (2013.01); *H04B 1/40* (2013.01)

(58) Field of Classification Search
  USPC ........................................ 333/132; 324/76.59
  See application file for complete search history.

(56) References Cited

U.S. PATENT DOCUMENTS

| | | |
|---|---|---|
| 2006/0267708 A1 | 11/2006 | Matsuda et al. |
| 2012/0208591 A1 | 8/2012 | Uejima |
| 2017/0331457 A1* | 11/2017 | Satoh ................... H01L 41/107 |
| 2018/0041194 A1* | 2/2018 | Ito ............................ H03H 9/25 |
| 2018/0109243 A1 | 4/2018 | Takamine |
| 2019/0007030 A1 | 1/2019 | Saji et al. |
| 2020/0382146 A1* | 12/2020 | Naniwa ..................... H03H 7/38 |

FOREIGN PATENT DOCUMENTS

| | | |
|---|---|---|
| JP | 2006-135921 A | 5/2006 |
| JP | 2006-333012 A | 12/2006 |
| JP | 2012-044290 A | 3/2012 |
| WO | 2016/208670 A1 | 12/2016 |
| WO | 2017/169514 A1 | 10/2017 |

OTHER PUBLICATIONS

Written Opinion for Application No. PCT/JP2019/006564 dated May 21, 2019.

\* cited by examiner

FIG. 1
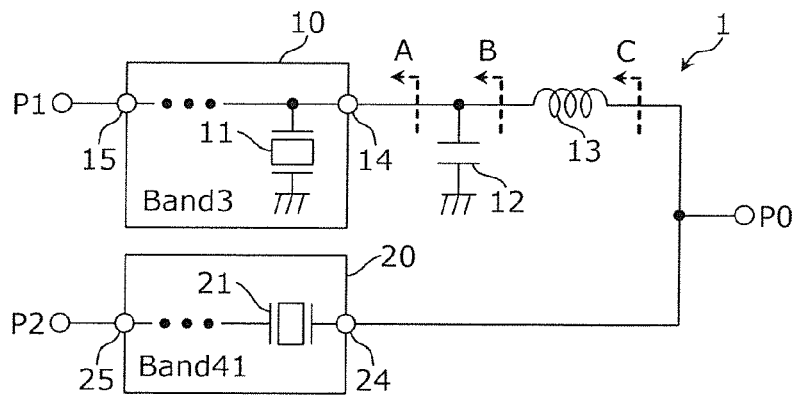
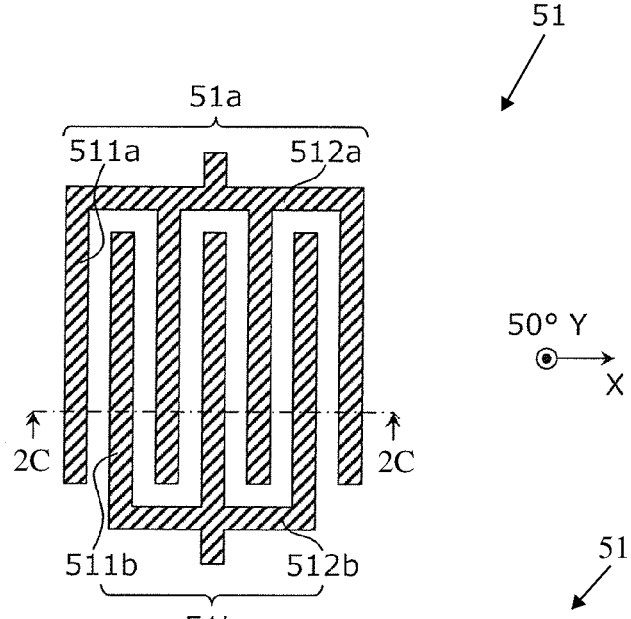
FIG. 2A
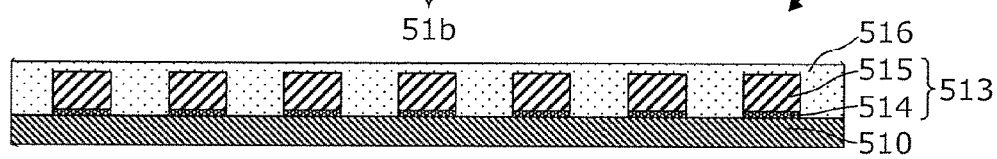
FIG. 2B
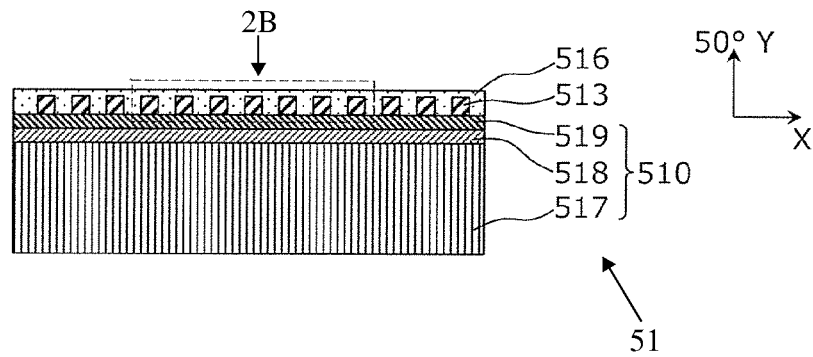
FIG. 2C

MULTIPLEXER, HIGH-FREQUENCY
FRONT-END CIRCUIT, AND
COMMUNICATION DEVICE

This is a continuation of International Application No. PCT/JP019/006564 filed on Feb. 21, 2019 which claims priority from Japanese Patent Application No. 2018-042063 filed on Mar. 8, 2018. The contents of these applications are incorporated herein by reference in their entireties.

BACKGROUND

The present disclosure relates to a multiplexer including an acoustic wave filter, a high-frequency front-end circuit, and a communication device.

Communication devices represented by smart phones in recent years support a so-called multi-band and multi-mode in which a single terminal performs communication in a plurality of pass bands (hereinafter simply referred to as bands), using a plurality of radio systems, and carrier aggregation in which communication is performed by simultaneously using a plurality of bands.

In a communication device supporting a plurality of bands, a multiplexer is disposed, in one antenna, for demultiplexing and multiplexing a plurality of high-frequency signals in different bands. Such a multiplexer is formed of, for example, a plurality of filters having different pass bands and connected to each other at a common connection point. The plurality of filters may use an acoustic wave filter having low-loss properties in a pass band.

International Publication No. 2016/208670 discloses a multiplexer in which one end portion of each of a plurality of acoustic wave filters is connected at a common connection point.

In a multiplexer supporting a plurality of bands, it is required to suppress insertion loss in each of the plurality of bands.

To meet such a requirement, for example, in the multiplexer of International Publication No. 2016/208670, an inductance element for impedance adjustment (a so-called series inductor) is provided between one acoustic wave filter of a plurality of acoustic wave filters and a common connection point. By adjusting impedance using the series inductor, for each of the plurality of filters viewed from the common connection point, it is possible to, while achieving impedance matching in a pass band of the relevant filter, increase impedance in a pass band in the filter for another filter.

However, in the multiplexer that adjusts impedance using the series inductor, it is inevitable that insertion loss due to the series inductor occurs. The insertion loss due to the series inductor is larger in a series inductor having a larger inductance value.

BRIEF SUMMARY

The present disclosure provides a multiplexer excellent in impedance matching and low-loss properties.

A multiplexer according to an aspect of the present disclosure includes, a common terminal, a first acoustic wave filter having a first frequency band as a pass band, and having a first input/output terminal connected to the common terminal, a second acoustic wave filter having a second frequency band higher than the first frequency band as a pass band, and having a second input/output terminal connected to the common terminal, an inductance element, and a first capacitance element. The first acoustic wave filter includes a parallel resonator of which one end is connected to the first input/output terminal and another end is connected to a ground electrode, the first input/output terminal being connected to the common terminal via the inductance element, and the first capacitance element is connected between a signal path between the one end of the parallel resonator and the inductance element, and a ground electrode.

According to this configuration, impedance of the first acoustic wave filter moved to a predetermined position on a Smith chart by the first inductance element, and impedance of the second acoustic wave filter are combined with each other at the common terminal. This makes it easy to design such that impedance of an entirety of the multiplexer viewed from the common terminal approaches reference impedance, for example, about 50Ω, and makes it easier to achieve more accurate impedance matching. Note that, the reference impedance is impedance serving as a reference for a transmission system in which the multiplexer is provided, and is not limited to about 50Ω, and may be about 75Ω, or the like.

At this time, a position of impedance in the second frequency band of the first acoustic wave filter viewed from the common terminal on the Smith chart, is moved to a short side by the parallel resonator. Thus, a smaller inductance value suffices for the first inductance element required to move the impedance to the predetermined position on a Smith chart, compared to a case where the first capacitance element is not included. Further, the first capacitance element improves return loss in the second frequency band at the first input/output terminal on one side of the first acoustic wave filter and suppresses outflow of an unnecessary wave generated by a high-order mode of the first acoustic wave filter.

As a result, a multiplexer excellent in impedance matching and low-loss properties can be obtained.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIG. 1 is a circuit diagram illustrating an example of a configuration of a multiplexer according to a first embodiment;

FIGS. 2A to 2C are a plan view and sectional views schematically illustrating an example of structure of a surface acoustic wave resonator according to the first embodiment;

DETAILED DESCRIPTION

Figure 3:
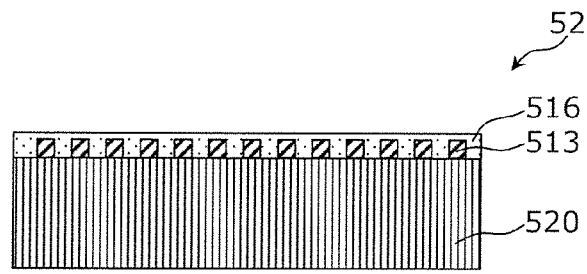
FIG. 3 is a sectional view schematically illustrating an example of structure of a surface acoustic wave resonator according to a modification example of the first embodiment.

Hereinafter, embodiments of the present disclosure will be described in detail with reference to the embodiments and the drawings. Note that, any of the embodiments to be described below represents a comprehensive or specific example. Numerical values, shapes, materials, constituent elements, arrangement and connection forms of the constituent elements, and the like illustrated in the following embodiments are mere examples and are not intended to limit the present disclosure.

First Embodiment

In a first embodiment, a multiplexer for demultiplexing and multiplexing a plurality of high-frequency signals in different bands will be described.

FIG. 1 is a circuit diagram illustrating an example of a configuration of the multiplexer according to the first embodiment. As illustrated in FIG. 1, a multiplexer 1 includes a common terminal P0, individual terminals P1 and P2, acoustic wave filters 10 and 20, an inductance element 13, and a capacitance element 12.

The acoustic wave filter 10 is a band pass filter having a first frequency band as a pass band. An example of the first frequency band is a downlink frequency band of 1805 MHz to 1880 MHz in Band3 defined in 3GPP. Here, the notation of 1805 MHz to 1880 MHz represents a frequency range of 1805 MHz or more and 1880 MHz or less. In the present specification, a frequency range will be described by similar notation.

The acoustic wave filter 10 includes a parallel resonator 11 and a pair of input/output terminals 14 and 15. However, another resonator (not illustrated) may be further provided. The other resonator may include at least one of a series resonator forming a signal path between the input/output terminals 14 and 15, a parallel resonator connected between the signal path between the input/output terminals 14 and 15, and a ground electrode, and a resonator forming a longitudinally coupled type filter unit.

One end of the parallel resonator 11 is connected to the input/output terminal 14, and the other end is connected to the ground electrode. The input/output terminal 14 is connected to the common terminal P0 via the inductance element 13. The first capacitance element 12 is connected between a signal path between one end of the parallel resonator 11 and the inductance element 13, and a ground electrode.

The acoustic wave filter 20 is a band pass filter having a second frequency band as a pass band. The second frequency band is a frequency band higher than the first frequency band, and is, for example, a frequency band of 2496 MHz to 2690 MHz in Band41 defined in 3GPP.

The acoustic wave filter 20 includes a series resonator 21 and a pair of input/output terminals 24 and 25, and may further include a resonator (not illustrated). Other resonators may include at least one of a series resonator forming a signal path between the input/output terminals 24 and 25, a parallel resonator connected between the signal path between the input/output terminals 24 and 25, and a ground electrode, and a resonator forming a longitudinally coupled type filter unit.

The series resonator 21 is connected between the input/output terminals 24 and 25, and the input/output terminal 24 is connected to the series resonator 21 out of the resonators included in the acoustic wave filter 20.

In such a configuration, the acoustic wave filter 10 is an example of a first acoustic wave filter, the acoustic wave filter 20 is an example of a second acoustic wave filter, and the capacitance element 12 is an example of a first capacitance element.

Each of the acoustic wave filters 10 and 20 may be a surface acoustic wave filter, and in this case, the resonators (including the parallel resonator 11 and the series resonator 21) included in the corresponding acoustic wave filters 10 and 20 may be formed of a surface acoustic wave resonator.

FIGS. 2A to 2C are diagrams schematically illustrating an example of structure of a surface acoustic wave resonator. FIG. 2A is a plan view, and each of FIGS. 2B and 2C is a sectional view taken along a dashed-dotted line illustrated in FIG. 2A and viewed in an arrow direction. FIG. 2B is an enlarged view of a portion of the resonator 51 surrounded by the dotted line in FIG. 2C. A resonator 51 illustrated in FIGS. 2A to 2C describes typical structure of a surface acoustic wave resonator, and when various parameters including the number and lengths of electrode fingers forming an electrode are appropriately set, the resonator 51 is applied to any resonator included in the acoustic wave filters 10 and 20.

The resonator 51 is formed of a piezoelectric substrate 510, and comb-shaped electrodes 51$a$ and 51$b$.

As illustrated in FIGS. 2A and 2B, a pair of the comb-shaped electrodes 51$a$ and 51$b$ facing each other is formed on the piezoelectric substrate 510.

The comb-shaped electrode 51$a$ is formed of a plurality of electrode fingers 511$a$ parallel to one another and a busbar electrode 512$a$ connecting the plurality of electrode fingers 511$a$. The comb-shaped electrode 51$b$ is formed of a plurality of electrode fingers 511$b$ parallel to one another and a busbar electrode 512$b$ connecting the plurality of electrode fingers 511$b$. The plurality of electrode fingers 511$a$ and 511$b$ is formed in a direction orthogonal to an X-axis direction.

The comb-shaped electrodes 51$a$ and 51$b$ are collectively referred to as an interdigital transducer (IDT) electrode 513.

As illustrated in FIG. 2B, the IDT electrode 513 has structure in which an adhesion layer 514 and a main electrode layer 515 are laminated.

The adhesion layer 514 is a layer for improving adhesion between the piezoelectric substrate 510 and the main electrode layer 515, and for example, Ti is used as a material. The adhesion layer 514 has a film thickness of, for example, about 12 nm.

As a material for the main electrode layer 515, for example, Al containing about 1% of Cu is used. A film thickness of the main electrode layer 515 is, for example, about 162 nm.

A protective layer 516 is formed so as to cover the comb-shaped electrodes 51a and 51b. The protective layer 516 is a layer intended to protect the main electrode layer 515 from an external environment, to adjust frequency-temperature characteristics, and to increase moisture resistance, and is, for example, a dielectric film containing silicon dioxide as a main component. A thickness of the protective layer 516 is, for example, about 250 nm.

Note that, the respective materials forming the adhesion layer 514, the main electrode layer 515, and the protective layer 516 are not limited to the materials described above. Further, the IDT electrode 513 may not have the laminated structure described above. The IDT electrode 513 may be formed of, for example, metal, such as Ti, Al, Cu, Pt, Au, Ag, or Pd, or alloy, or may be formed of a plurality of laminated bodies formed of the metal or alloy described above. Further, the protective layer 516 may not be formed.

Next, laminated structure of the piezoelectric substrate 510 will be described.

As illustrated in FIG. 2C, the piezoelectric substrate 510 includes a high acoustic velocity support substrate 517, a low acoustic velocity film 518, and a piezoelectric film 519, and has structure in which the high acoustic velocity support substrate 517, the low acoustic velocity film 518, and the piezoelectric film 519 are laminated in this order.

The piezoelectric film 519 is formed of a 50° Y-cut X-propagation $LiTaO_3$ piezoelectric single crystal or piezoelectric ceramics. That is, the piezoelectric film 519 is a lithium tantalate single crystal cut along a plane having an axis that is rotated about an X-axis by about 50° from a Y-axis as a normal line or ceramics, and is formed of a single crystal or ceramics in which a surface acoustic wave propagates in the X-axis direction. The piezoelectric film 519 has, for example, a thickness of about 600 nm. Note that, depending on required specifications for each filter, a material, cut-angles, and a thickness of the piezoelectric single crystal used for the piezoelectric film 519 are appropriately selected.

The high acoustic velocity support substrate 517 is a substrate that supports the low acoustic velocity film 518, the piezoelectric film 519, and the IDT electrode 513. The high acoustic velocity support substrate 517 is, additionally, a substrate in which acoustic velocity of a bulk wave in the high acoustic velocity support substrate 517 is higher than that of an acoustic wave, such as a surface acoustic wave or a boundary wave propagating through the piezoelectric film 519, and functions to confine a surface acoustic wave to a part where the piezoelectric film 519 and the low acoustic velocity film 518 are laminated, and to suppress the surface acoustic wave from leaking to the high acoustic velocity support substrate 517. The high acoustic velocity support substrate 517 is, for example, a silicon substrate, and has a thickness of, for example, about 200 μm.

The low acoustic velocity film 518 is a film in which acoustic velocity of a bulk wave in the low acoustic velocity film 518 is lower than that of a bulk wave propagating through the piezoelectric film 519, and is disposed between the piezoelectric film 519 and the high acoustic velocity support substrate 517. Due to this structure and a property that energy of an acoustic wave essentially concentrates in a medium in which acoustic velocity is low, leakage of energy of a surface acoustic wave outside the IDT electrode 513 is suppressed. The low acoustic velocity film 518 is, for example, a film containing silicon dioxide as a main component, and has a thickness of, for example, about 670 nm.

Note that, according to the laminated structure described above of the piezoelectric substrate 510, a Q-value at each of a resonant frequency and an anti-resonant frequency can be significantly increased, as compared with structure in the related art in which a piezoelectric substrate is used as a single layer. That is, since an acoustic wave resonator having a high Q value can be formed, it is possible to form a filter having small insertion loss by using the acoustic wave resonator.

Note that, the high acoustic velocity support substrate 517 may have structure in which a support substrate and a high acoustic velocity film are laminated. A high acoustic velocity film refers to a film in which acoustic velocity of a bulk wave propagating therethrough is higher than an acoustic wave, such as a surface acoustic wave or a boundary wave propagating through the piezoelectric film 519.

In this case, for a support substrate, a piezoelectric body, such as lithium tantalate, lithium niobate, or quartz, various ceramics, such as alumina, magnesia, silicon nitride, aluminum nitride, silicon carbide, zirconia, cordierite, mullite, steatite, and forsterite, a dielectric material, such as glass or sapphire, or a semiconductor, such as silicon or gallium nitride, and a resin substrate, and the like, can be used.

Additionally, for a high acoustic velocity film, various high acoustic velocity materials can be used, such as aluminum nitride, aluminum oxide, silicon carbide, silicon nitride, silicon oxynitride, a DLC film, or diamond, a medium containing the material mentioned above as a main component, a medium containing a mixture of the above materials as a main component, and the like.

The surface acoustic wave resonator 51 in which the IDT electrode 513 is formed on the piezoelectric substrate 510 having the laminated structure has been illustrated, but the structure of the surface acoustic wave resonator is not limited to this example.

FIG. 3 is a sectional view schematically illustrating an example of structure of a surface acoustic wave resonator according to a modification example of the first embodiment. As illustrated in FIG. 3, a resonator 52 is formed of a piezoelectric single crystal substrate 520 formed of a single layer of a piezoelectric body, the IDT electrode 513 formed on the piezoelectric single crystal substrate 520, and the protective layer 516 formed on the piezoelectric single crystal substrate 520 and on the IDT electrode 513.

The piezoelectric single crystal substrate 520 is formed of, for example, a piezoelectric single crystal of $LiNbO_3$. As with the piezoelectric film 519, for the piezoelectric single crystal substrate 520 as well, a material, cut-angles, and a thickness of the piezoelectric single crystal are appropriately selected according to required specifications for respective filters.

Hereinafter, a characteristic configuration and effects of the multiplexer 1 as an example will be described, in comparison with a multiplexer according to a comparative example.

Figure 4:
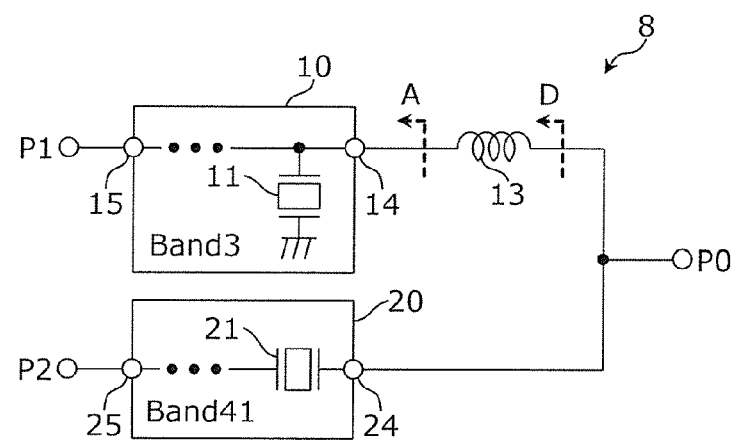
FIG. 4 is a circuit diagram illustrating an example of a configuration of a multiplexer according to a comparative example of the first embodiment.

FIG. 4 is a circuit diagram illustrating an example of a configuration of a multiplexer 8 according to the comparative example. The multiplexer 8 differs from the multiplexer 1 in FIG. 1 in that the capacitance element 12 is not included.

Figure 5:
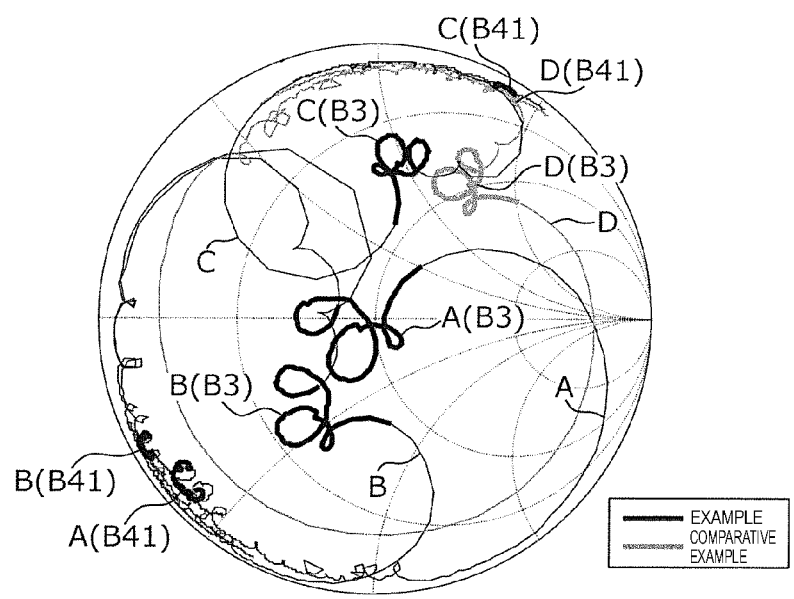
FIG. 5 is a Smith chart showing an example of impedance when a main part of a multiplexer according to an example and a main part of the multiplexer according to the comparative example of the first embodiment are viewed.

FIG. 5 is a Smith chart showing an example of impedance when respective main parts of the multiplexers 1 and 8 are viewed. In FIG. 5, four examples of impedance A to impedance D are shown.

The impedance A is impedance when the acoustic wave filter 10 is viewed from a point A of each of the multiplexers 1 and 8.

The impedance B is impedance when the capacitance element 12 is viewed from a point B of the multiplexer 1.

The impedance C is impedance when the inductance element 13 is viewed from a point C of the multiplexer 1.

The impedance D is impedance when the inductance element 13 is viewed from a point D of the multiplexer 8.

In each of the impedance A to impedance D, a part corresponding to a first frequency band (downlink frequency band in Band3) and a part corresponding to a second frequency band (frequency band in Band41) are each indicated by a bold line.

In the multiplexer 1, when the impedance C and impedance (not illustrated) of the acoustic wave filter 20 are combined, impedance of an entirety of the multiplexer 1 approaches, for example, reference impedance of about 50Ω, or the like, and in the multiplexer 8, when the impedance D and impedance (not illustrated) of the acoustic wave filter 20 are combined, impedance of an entirety of the multiplexer 8 approaches, for example, the reference impedance of about 50Ω, or the like. Here, the reference impedance is impedance serving as a reference for a transmission system in which the multiplexer 1 or 8 is provided, and is not limited to about 50Ω, and may be about 75Ω, or the like.

As seen in FIG. 5, in the example, a position of impedance in the second frequency band of the acoustic wave filter 10 on the Smith chart is first moved from a position A(B41) to a position B(B41) on a short side by the parallel resonator 11. Then, the position is moved from the position B(B41) to a position C(B41) before the combination with the acoustic wave filter 20, by the inductance element 13.

On the other hand, in the comparative example, a position of impedance in the second frequency band of the acoustic wave filter 10 on the Smith chart is moved, by the inductance element 13, from the position A(B41) to a position D(B41) before the combination with the acoustic wave filter 20.

Assuming that the position D(B41) and the position C(B41) are substantially the same position, an amount of movement of the impedance by the inductance element 13 in a case where the capacitance element 12 is included is smaller than that in a case where the capacitance element 12 is not included. That is, by providing the capacitance element 12, impedance matching can be achieved with the inductance element 13 having a smaller inductance value, and thus insertion loss is improved.

Further, the position B(B41) after being moved by the capacitance element 12 is located closer to an outer periphery on the Smith chart, than the position A(B41) before the movement. Thus, return loss in the second frequency band of the acoustic wave filter 10 when viewed from the common terminal P0 is improved.

Figure 6:
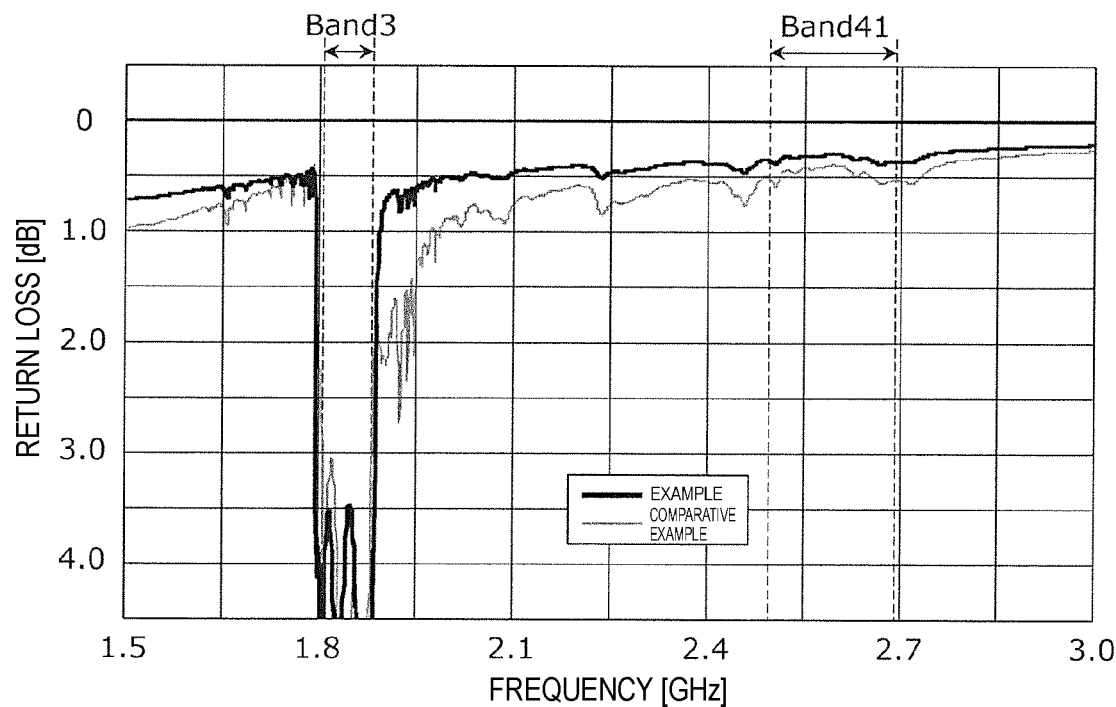
FIG. 6 is a graph showing an example of return loss of the respective multiplexers according to the example and the comparative example of the first embodiment.

FIG. 6 is a graph illustrating an example of return loss of the acoustic wave filter 10 viewed from the common terminal P0 in each of the multiplexers 1 and 8. From the graph in FIG. 6, it can be seen that in the multiplexer 1, return loss in the second frequency band is improved, compared to the multiplexer 8.

Further, the capacitance element 12 suppresses outflow of an unnecessary wave generated by a high-order mode of the acoustic wave filter 10.

As described above, with the multiplexer 1 provided with the capacitance element 12, a multiplexer excellent in impedance matching and low-loss properties is obtained, compared to the multiplexer 8 not including the capacitance element 12.

Note that, in the above description, the example has been illustrated in which the first frequency band is the downlink frequency band of 1805 MHz to 1880 MHz in Band3 in 3GPP, and the second frequency band is the frequency band of 2496 MHz to 2690 MHz in Band41 in 3GPP, but the present disclosure is not limited to this example.

For example, as will be described later, the first frequency band may be the downlink frequency band of 1805 MHz to 1880 MHz in Band3 in 3GPP, and the second frequency band may be a frequency band of 2300 MHz to 2400 MHz in Band40 in 3GPP.

In addition, the first frequency band may be the downlink frequency band of 1805 MHz to 1880 MHz in Band3 in 3GPP, and the second frequency band may be a downlink frequency band of 2350 MHz to 2360 MHz in Band30 in 3GPP.

Second Embodiment

In a second embodiment, a multiplexer in which a capacitance element is incorporated in an acoustic wave filter will be described.

Figure 7:
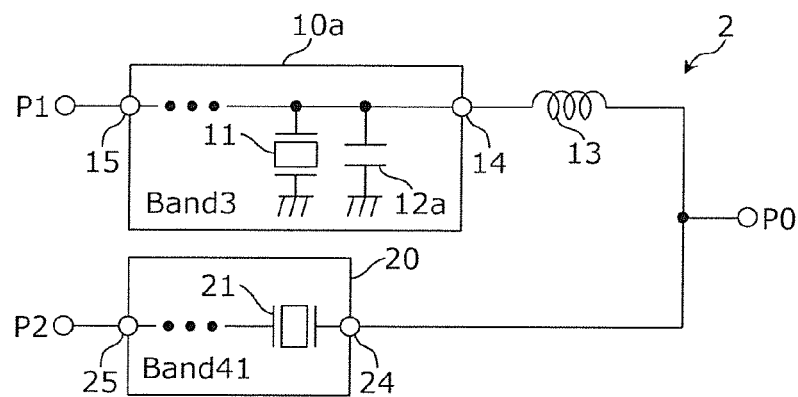
FIG. 7 is a circuit diagram illustrating an example of a configuration of a multiplexer according to a second embodiment.

FIG. 7 is a circuit diagram illustrating an example of a configuration of a multiplexer according to the second embodiment. As illustrated in FIG. 7, in the multiplexer 2, a capacitance element 12a is incorporated in an acoustic wave filter 10a.

Figure 8:
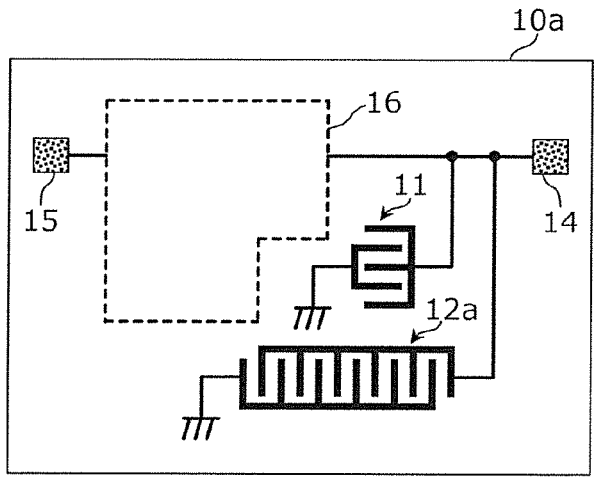
FIG. 8 is a plan view schematically illustrating an example of structure of an acoustic wave filter according to the second embodiment.

FIG. 8 is a plan view schematically illustrating an example of structure of the acoustic wave filter 10a. As illustrated in FIG. 8, in the acoustic wave filter 10a, the capacitance element 12a may be formed of an IDT electrode for which an orientation is changed by 90 degrees from that of IDT electrodes of resonators including the parallel resonator 11 that forms the acoustic wave filter 10a.

Thereby, the capacitance element 12a having no resonance and antiresonance is formed in a small space.

In addition to the parallel resonator 11, the acoustic wave filter 10a may include, for example, at least one of a series resonator forming a signal path between the input/output terminals 14 and 15, a parallel resonator connected between the signal path between the input/output terminals 14 and 15, and a ground electrode, and a resonator forming a longitudinally coupled type filter unit. Each of these resonators may be formed in a region 16, for example, of an IDT electrode having the same orientation as that of the IDT electrode forming the parallel resonator 11.

According to the acoustic wave filter 10a, since the number of components is reduced, it is possible to utilize a module space and reduce component costs.

Third Embodiment

In a third embodiment, a multiplexer in which the acoustic wave filter 20 and the common terminal P0 are connected to each other via a capacitance element will be described.

Figure 9:
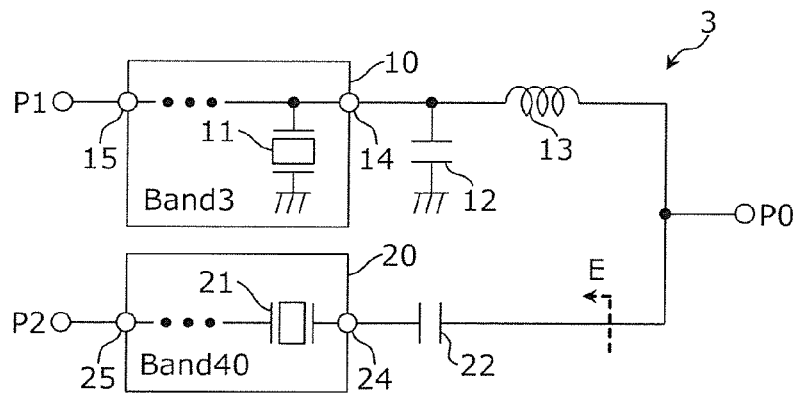
FIG. 9 is a circuit diagram illustrating an example of a configuration of a multiplexer according to a third embodiment.

FIG. 9 is a circuit diagram illustrating an example of a configuration of a multiplexer according to the third embodiment. As illustrated in FIG. 9, a multiplexer 3 is different from the multiplexer 1 in FIG. 1 in that a capacitance element 22 is added. In the multiplexer 3, the input/output terminal 24 of the acoustic wave filter 20 is connected to the common terminal P0 via the capacitance element 22.

Hereinafter, a characteristic configuration and effects of the multiplexer 3 as an example will be described, in comparison with the multiplexer 1 in the first embodiment. Note that, in the following description, for example, a first frequency band is a downlink frequency band of 1805 MHz to 1880 MHz in Band3 defined in 3GPP, and a second frequency band is a frequency band of 2300 MHz to 2400 MHz in Band40 defined in 3GPP.

Figure 10:
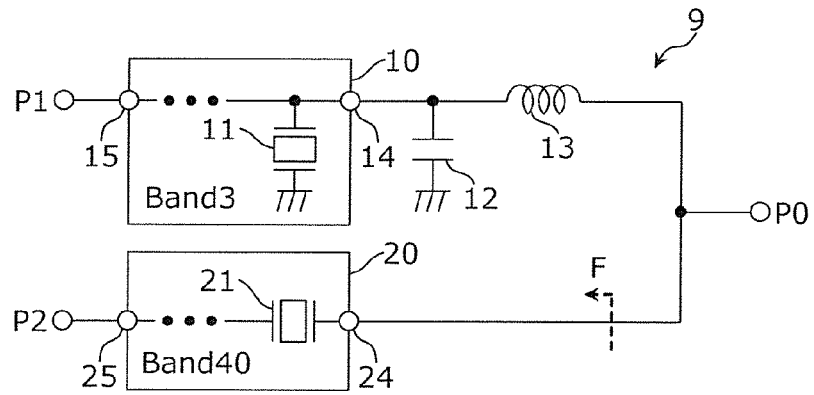
FIG. 10 is a circuit diagram illustrating an example of a configuration of a multiplexer according to a comparative example of the third embodiment.

FIG. 10 is a circuit diagram illustrating an example of a configuration of a multiplexer 9 according to a comparative example. The multiplexer 9 has the same configuration as that of the multiplexer 1 illustrated in FIG. 1, and the pass band of the acoustic wave filter 20 is changed from Band41 to Band40.

Figure 11:
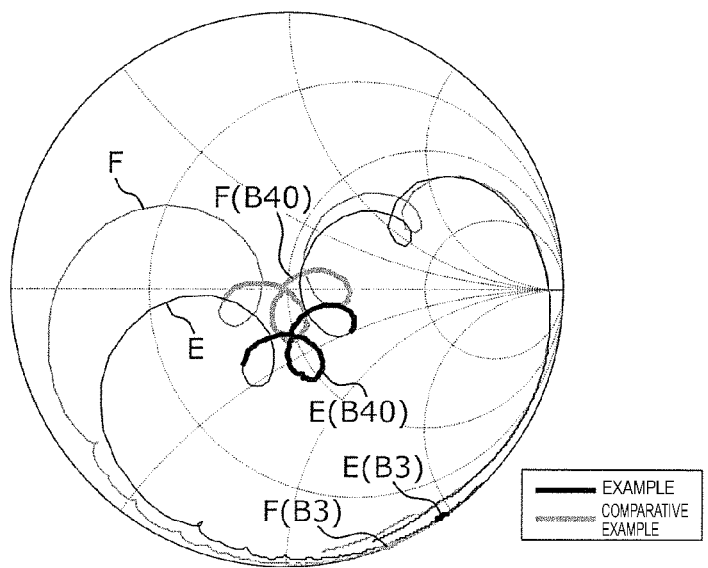
FIG. 11 is a Smith chart showing an example of impedance of a main part of a multiplexer according to an example and a main part of the multiplexer according to the comparative example of the third embodiment.

FIG. 11 is a Smith chart showing an example of impedance when respective main parts of the multiplexers 3 and 9 are viewed. In FIG. 11, two examples of impedance E and impedance F are shown.

The impedance E is impedance when the capacitance element 22 is viewed from a point E of the multiplexer 3.

The impedance F is impedance when the acoustic wave filter 20 is viewed from a point F of the multiplexer 9.

In each of the impedance E and impedance F, a part corresponding to the first frequency band (downlink frequency band in Band3) and a part corresponding to the second frequency band (frequency band in Band40) are each indicated by a bold line.

In the multiplexer 3, when the impedance E and impedance (not illustrated) of the acoustic wave filter 20 after adjustment by the capacitance element 12 and the inductance element 13 are combined, impedance of an entirety of the multiplexer approaches, for example, reference impedance of about 50Ω, or the like, and in the multiplexer 9, when the impedance F and impedance (not illustrated) of the acoustic wave filter 20 after adjustment by the capacitance element 12 and the inductance element 13 are combined, impedance of an entirety of the multiplexer approaches, for example, the reference impedance of about 50 SI, or the like. Here, the reference impedance is impedance serving as a reference for a transmission system in which the multiplexer 3 or 9 is provided, and is not limited to about 50Ω, and may be about 75Ω, or the like.

As seen in FIG. 11, impedance in the first frequency band of the acoustic wave filter 20 is at a position F(B3) on the Smith chart in the first embodiment. On the other hand, in the present embodiment, the capacitance element 22 moves the impedance from the position F(B3) in the comparative example to a position E(B3) on an open side.

As a result, in the example, insertion loss in the first frequency band of the multiplexer is further improved as compared with the comparative example.

Figure 12:
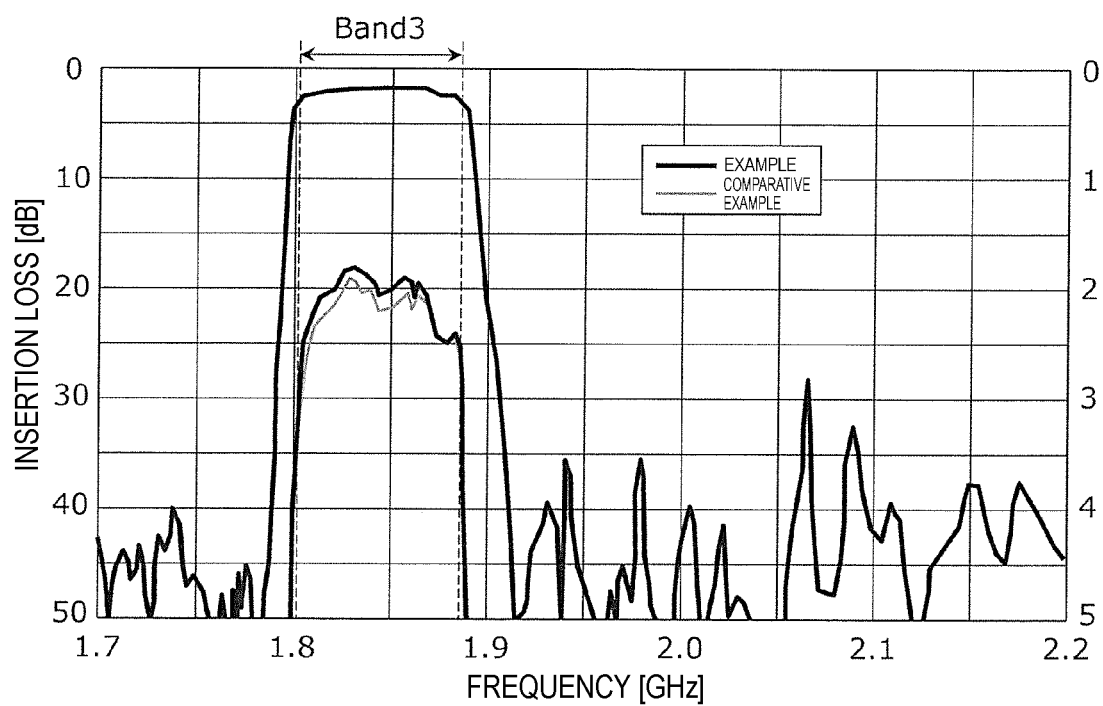
FIG. 12 is a graph showing an example of insertion loss of the respective multiplexers according to the example and the comparative example of the third embodiment.

FIG. 12 is a graph showing an example of insertion loss between the terminals P0 and P1 of each of the multiplexer 3 and the multiplexer 9. In FIG. 12, insertion loss in a pass band is enlarged and shown in accordance with a scale on a right side of the graph.

Figure 13:
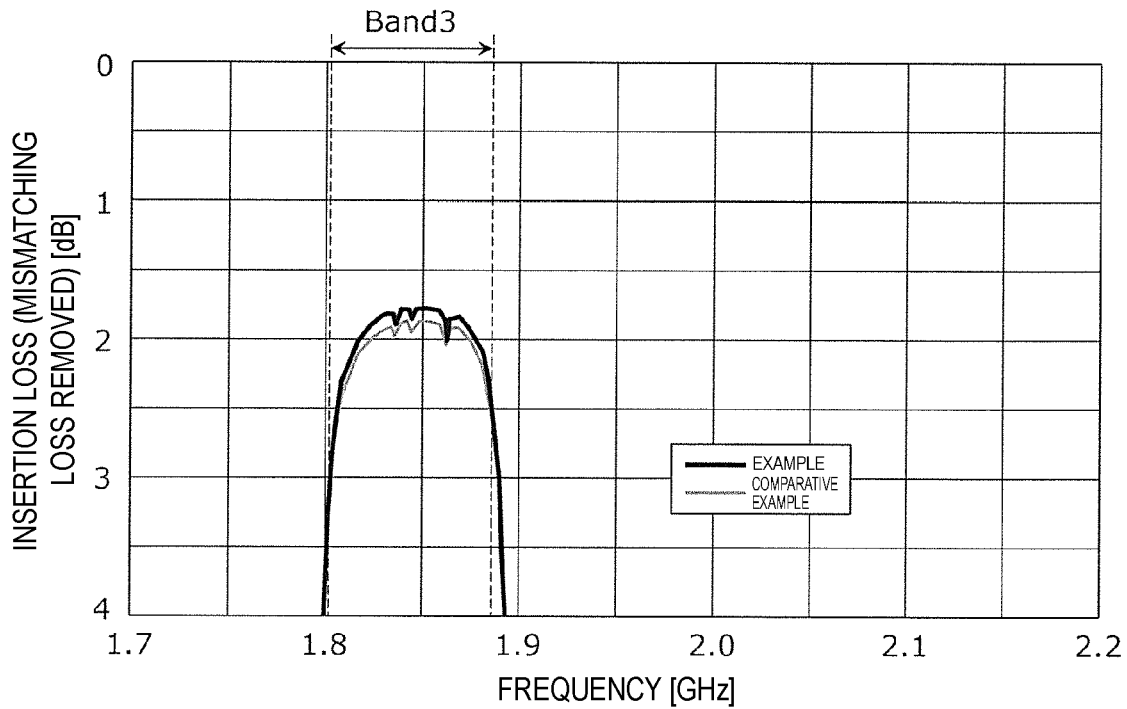
FIG. 13 is a graph showing an example of the insertion loss of the respective multiplexers according to the example and the comparative example of the third embodiment.

FIG. 13 is a graph showing an example of insertion loss when mismatching loss between the terminals P0 and P1 of each of the multiplexers 3 and 9 is removed.

From FIGS. 12 and 13, it can be seen that insertion loss in Band3 is smaller in the example using the multiplexer 3, than in the comparative example using the multiplexer 9. This is, as can be seen in FIG. 11, considered to be due to a fact that the part E(B3) of the impedance E is located closer to an open side, than the part F(B3) of the impedance F. That is, in the multiplexer 3 in which the filter 20 is viewed from the common terminal P0 via the capacitance element 22, since impedance in Band3 is higher, compared to the multiplexer 9 in which the filter 20 is directly viewed from the common terminal P0, it is considered that leakage of a signal in Band3 to the filter 20 is reduced.

As described above, from FIGS. 12 and 13, it was confirmed that, in the example using the multiplexer 3, the insertion loss is smaller than that in the comparative example using the multiplexer 9.

Fourth Embodiment

In a fourth embodiment, a high-frequency front-end circuit including the multiplexer 3 described in the third embodiment, and a communication device including the high-frequency front-end circuit will be described.

Figure 14:
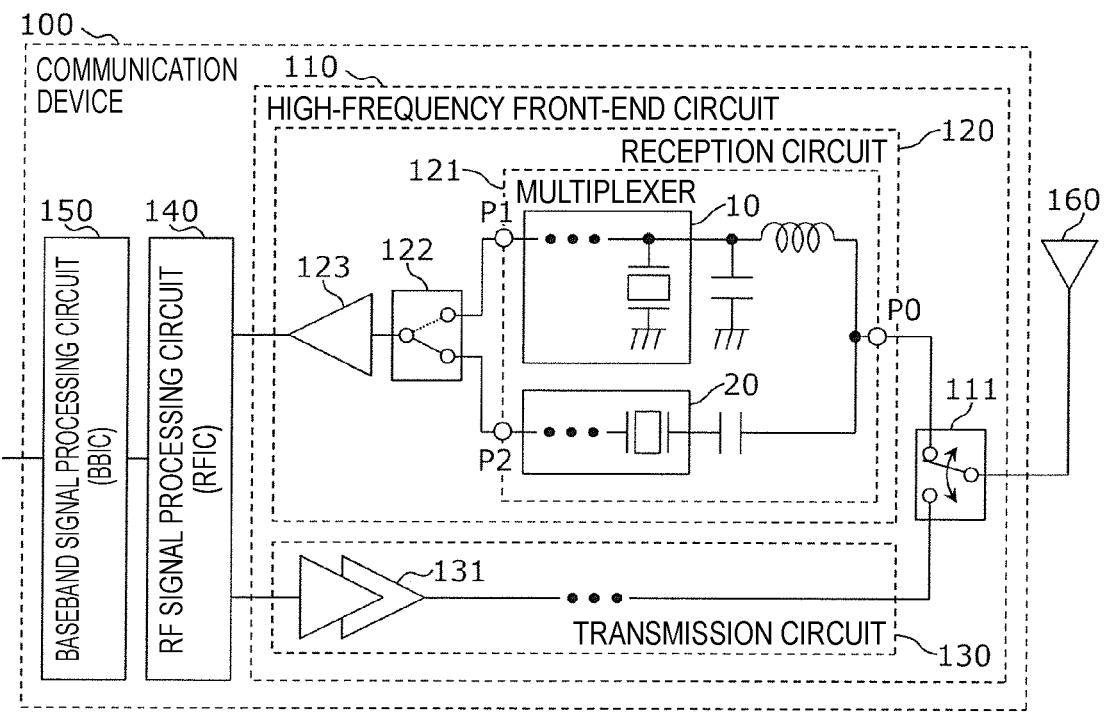
FIG. 14 is a block diagram illustrating an example of a functional configuration of a communication device according to a fourth embodiment.

FIG. 14 is a configuration diagram of a communication device 100 according to the fourth embodiment. The communication device 100 includes a high-frequency front-end circuit 110, an RF signal processing circuit 140, and a baseband signal processing circuit 150. Note that, in FIG. 14, an antenna 160 connected to the communication device 100 is also illustrated.

The high-frequency front-end circuit 110 includes a switch 111, a reception circuit 120, and a transmission circuit 130.

The reception circuit 120 includes a multiplexer 121, a switch 122, and a low-noise amplifier 123.

The multiplexer 121 is, for example, the multiplexer 3 according to the third embodiment.

The switch 122, in accordance with a control signal (not illustrated), selectively connects any one of the individual terminals P1 and P2 of the multiplexer 121 to an input terminal of the low-noise amplifier 123. The switch 122 may simultaneously connect both of the individual terminals P1 and P2 of the multiplexer 121 to the input terminal of the low-noise amplifier 123. Accordingly, the high-frequency front-end circuit 110 can support carrier aggregation.

The low-noise amplifier 123 amplifies a high-frequency signal (here, a high-frequency reception signal) supplied from the antenna 160 via the switch 111, the multiplexer 121, and the switch 122, and outputs the amplified high-frequency signal to the RF signal processing circuit 140.

The transmission circuit 130 includes a power amplifier 131.

The power amplifier 131 amplifies a high-frequency signal (here, a high-frequency transmission signal) supplied from the RF signal processing circuit 140, and outputs the amplified high-frequency signal to the antenna 160 via the switch 111.

A multiplexer similar to that of the reception circuit 120 may be provided also in the transmission circuit 130 (not illustrated).

The RF signal processing circuit 140 converts a high-frequency reception signal supplied from the high-frequency front-end circuit 110 into a reception signal, and supplies the reception signal to the baseband signal processing circuit 150. The conversion may include demodulation and down-conversion of a signal. The RF signal processing circuit 140 also converts a transmission signal generated by the baseband signal processing circuit 150 into a transmission RF signal, and supplies the transmission RF signal to the high-frequency front-end circuit 110. The conversion may include modulation and up-conversion of a signal. The RF signal processing circuit 140 may be formed of a high-frequency integrated circuit (RFIC) chip.

The baseband signal processing circuit 150 converts transmission data generated by application devices/application software (not illustrated) for performing voice call, image display, and the like into a transmission signal, and supplies the transmission signal to the RF signal processing circuit 140. The conversion may also include data compression, multiplexing, and addition of an error correction code. Further, a reception signal received from the RF signal processing circuit 140 is converted into reception data, and the reception data is supplied to the application devices/application software. The conversion may include data decompression, demultiplexing, and error correction. The baseband signal processing circuit 150 may also be formed of a baseband integrated circuit (BBIC) chip.

Note that, the high-frequency front-end circuit 110 may include another circuit element between the constituent elements described above.

According to the high-frequency front-end circuit 110 and the communication device 100 formed as described above, the multiplexer 3 according to the third embodiment described above is provided, and thus it is possible to obtain the high-frequency front-end circuit 110 and the communication device 100 excellent in impedance matching and low-loss properties.

Note that, the multiplexer 2 according to the second embodiment or the multiplexer 3 according to the third embodiment may be used, as the multiplexer 121 of the high-frequency front-end circuit 110 instead of the multiplexer 1 according to the first embodiment.

In addition, the communication device 100 may not include the baseband signal processing circuit 150, depending on a processing scheme of a high-frequency signal.

Other Modification Examples, and the Like

The multiplexers 1 to 3 according to the first to third embodiments, and the high-frequency front-end circuit 110 and the communication device 100 according to the fourth embodiment have been described above, but the present disclosure is not limited to the embodiments described above. For example, an aspect in which the following modification is applied to the embodiment described above may also be included in the present disclosure.

For example, in the above description, a diplexer has been described as an example of each of the multiplexers 1 to 3, but the present disclosure can also be applied to, for example, a multiplexer that demultiplexes and multiplexes high-frequency signals in three or more bands. That is, it is sufficient that a multiplexer is provided with two or more filters.

Further, the multiplexer according to the embodiments of the present disclosure is not limited to the configuration including only the plurality of reception filters, and may be configured to include only a plurality of transmission filters, or both a reception filter and a transmission filter.

According to the multiplexer, the high-frequency front-end circuit, and the communication device according to the embodiments of the present disclosure, it is possible to obtain a multiplexer, a high-frequency front-end circuit, and a communication device excellent in impedance matching and low-loss properties.

The present disclosure is widely applicable to a communication device, such as a mobile phone, as a multiplexer, a high-frequency front-end circuit, a communication device, or the like with low-loss that can adapt to frequency standards supporting a multi-band and a multi-mode.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A multiplexer, comprising:
   a common terminal;
   a first acoustic wave filter having a first pass band, and comprising a first input/output terminal connected to the common terminal;
   a second acoustic wave filter having a second pass band, and comprising a second input/output terminal connected to the common terminal, the second pass band being higher in frequency than the first pass band;
   an inductance element; and
   a first capacitance element, wherein:
   the first acoustic wave filter comprises a parallel resonator having a first end that is connected to the first input/output terminal and a second end that is connected to a ground electrode, the first input/output terminal being connected to the common terminal via the inductance element, and
   the first capacitance element is connected between a signal path and the ground electrode, the signal path being between the first end of the parallel resonator and the inductance element.

2. The multiplexer according to claim 1, wherein the first capacitance element is incorporated in the first acoustic wave filter.

3. The multiplexer according to claim 1, wherein the second acoustic wave filter comprises one or more resonators, the one or more resonators comprising a series resonator connected to the second input/output terminal.

4. The multiplexer according to claim 1, further comprising:
   a second capacitance element,
   wherein the second input/output terminal of the second acoustic wave filter is connected to the common terminal via the second capacitance element.

5. The multiplexer according to claim 1, wherein:
   the first acoustic wave filter is on a piezoelectric substrate, and
   the piezoelectric substrate comprises:
      a piezoelectric film on a first surface of the piezoelectric substrate, the first surface comprising an interdigital transducer (IDT) electrode thereon,
      a high acoustic velocity support substrate configured to propagate a bulk wave at a greater acoustic velocity than the piezoelectric film, and
      a low acoustic velocity film between the high acoustic velocity support substrate and the piezoelectric film, the low acoustic velocity film being configured to propagate a bulk wave at a lower acoustic velocity than the piezoelectric film.

6. The multiplexer according to claim 1, wherein the first acoustic wave filter comprises:
   a piezoelectric single crystal substrate of lithium niobate ($LiNbO_3$),
   an interdigital transducer (IDT) electrode on the piezoelectric single crystal substrate, and
   a dielectric film on the piezoelectric single crystal substrate and the IDT electrode.

7. The multiplexer according to claim 1, wherein:
   the first pass band is 1805 MHz to 1880 MHz, and
   the second pass band is 2300 MHz to 2400 MHz.

8. The multiplexer according to claim 1, wherein:
   the first pass band is 1930 MHz to 1995 MHz, and
   the second pass band is 2350 MHz to 2360 MHz.

9. A high-frequency front-end circuit, comprising:
the multiplexer according to claim 1; and
an amplifier circuit connected to the multiplexer.

10. A communication device, comprising:
a radio frequency (RF) signal processing circuit configured to process a high-frequency signal transmitted and received by an antenna; and
the high-frequency front-end circuit according to claim 9 configured to transmit the high-frequency signal between the antenna and the RF signal processing circuit.

* * * * *

UNITED STATES PATENT AND TRADEMARK OFFICE
CERTIFICATE OF CORRECTION

| | |
|---|---|
| PATENT NO. | : 11,437,978 B2 |
| APPLICATION NO. | : 16/998286 |
| DATED | : September 6, 2022 |
| INVENTOR(S) | : Yusuke Naniwa and Masakazu Tani |

It is certified that error appears in the above-identified patent and that said Letters Patent is hereby corrected as shown below:

In the Specification

Column 9, Line 38:
"of about 50 SI, or the like." should be --of about 50 Ω, or the like.--

Signed and Sealed this
Ninth Day of May, 2023

Katherine Kelly Vidal
*Director of the United States Patent and Trademark Office*